United States Patent [19]
Fukunaga et al.

[11] Patent Number: 5,610,606
[45] Date of Patent: Mar. 11, 1997

[54] 1-BIT D/A CONVERSION CIRCUIT

[75] Inventors: Toshitaka Fukunaga, Kawasaki; Mitsuru Nagata, Kanagawa-ken, both of Japan

[73] Assignee: Kabushiki Kaisha Toshiba, Kawasaki, Japan

[21] Appl. No.: 277,265

[22] Filed: Jul. 21, 1994

[30] Foreign Application Priority Data

Jul. 21, 1993 [JP] Japan ................................ 5-179506

[51] Int. Cl.$^6$ ................................................. H03M 3/00
[52] U.S. Cl. ........................... 341/143; 341/144; 341/152
[58] Field of Search .................................... 341/143, 144, 341/152

[56] References Cited

U.S. PATENT DOCUMENTS

| | | | |
|---|---|---|---|
| 4,823,128 | 4/1989 | Barak | 341/144 |
| 5,379,040 | 1/1995 | Mizomoto et al. | 341/143 |

FOREIGN PATENT DOCUMENTS

| | | |
|---|---|---|
| 4-150416 | 5/1992 | Japan . |
| 7-106974 | 4/1995 | Japan . |

OTHER PUBLICATIONS

IEEE Journal of Solid–State Circuits, vol.–SC–22–No.3, "A CMOS Stereo 16 Bit D/A Converter for Digital Audio", Peter J. A. Naus, et al., Jun. 1987, pp. 390–394.

IEEE Journal of Solid–State Circuits, vol.–SC–26–No.12, "A Monolithic A/D and D/A Converter With Filter For Broad–Band Speech Coding", Renee G. Lerch, et al., Dec. 1991, pp. 1920–1927.

Radio Technique, Aieh publication Co. Ltd in Japan, "The Design Concept and Application Technique Of The Original 1 Bit DAC", Shinji Aoshima, Nov. 1990, pp. 152–157.

Primary Examiner—Todd Deboer
Attorney, Agent, or Firm—Oblon, Spivak, McClelland, Maier & Neustadt, P.C.

[57] ABSTRACT

A 1-bit D/A conversion circuit according to the present invention comprises an RZ signal generating circuit and a PRZ signal generating circuit. The RZ signal generating circuit receives 1-bit digital data sampled at a predetermined frequency, converts the digital data into a first RZ signal and a second RZ signal complementary to the first RZ signal, shifts the first and second RZ signals with respect to each other by an integral multiple of the predetermined frequency, which is greater than one, and outputs these RZ signals. The PRZ signal generating circuit receives the first and second RZ signals, combines these signals together, and outputs a signal which is a type of a PRZ signal.

14 Claims, 15 Drawing Sheets

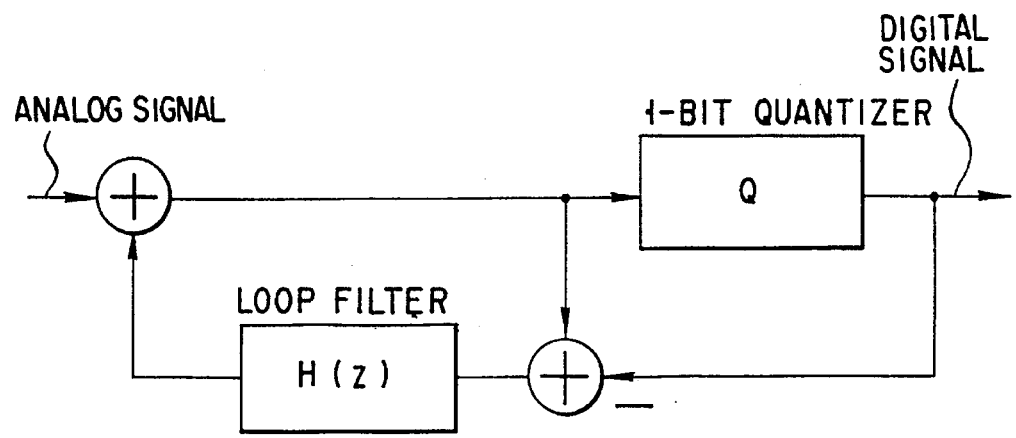
F I G. 1

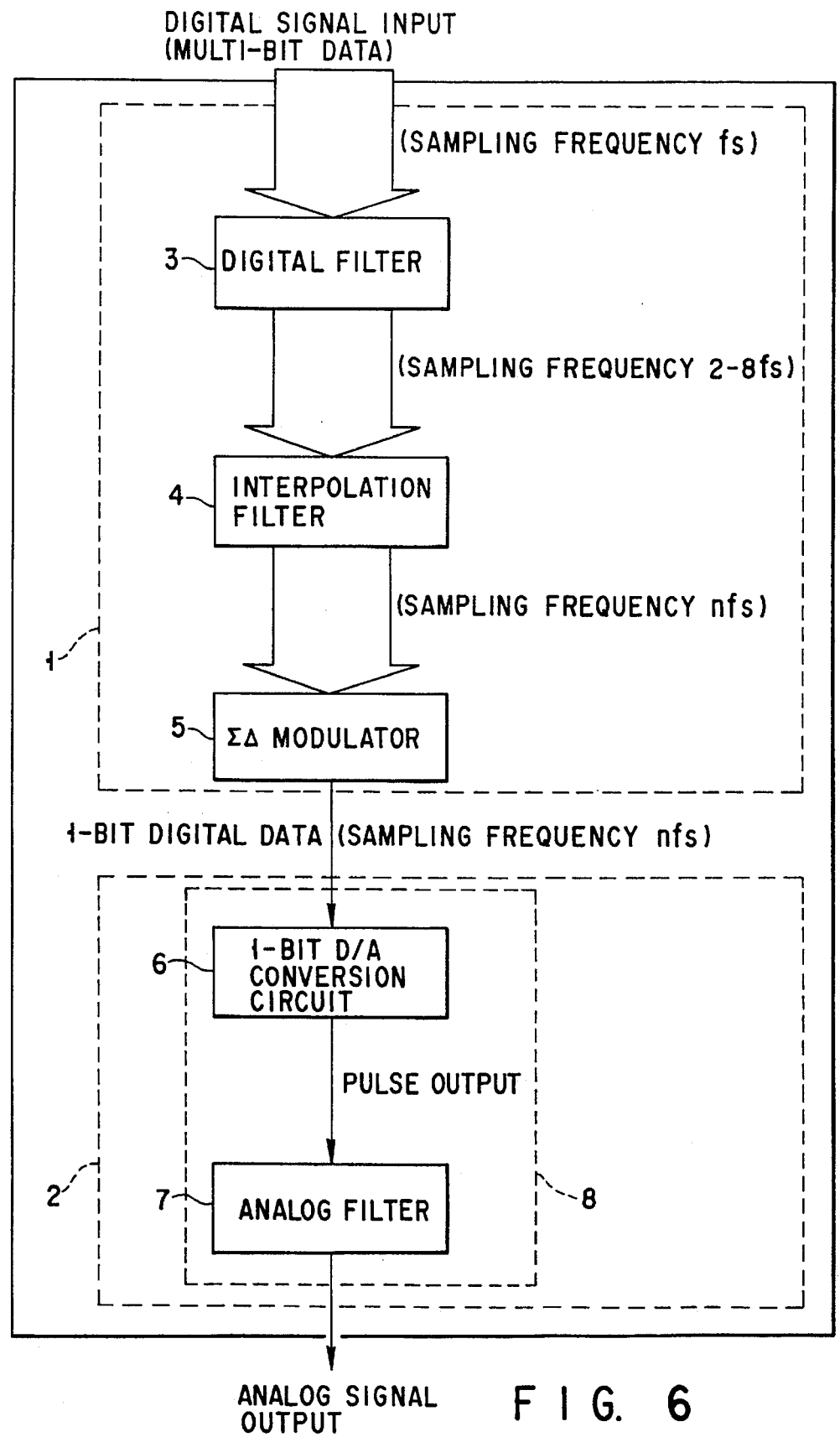
F I G. 6

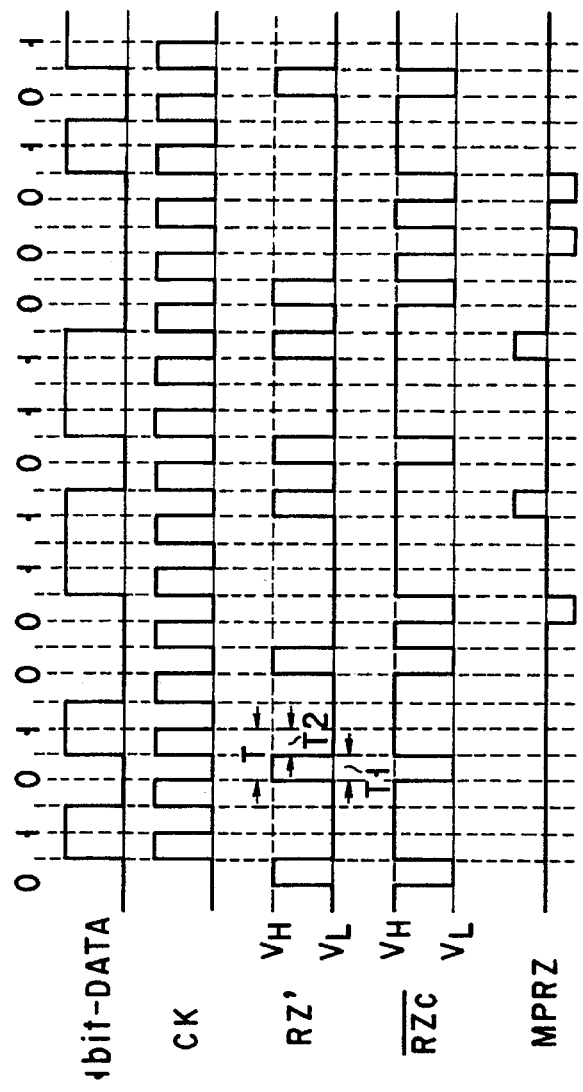
F I G. 12
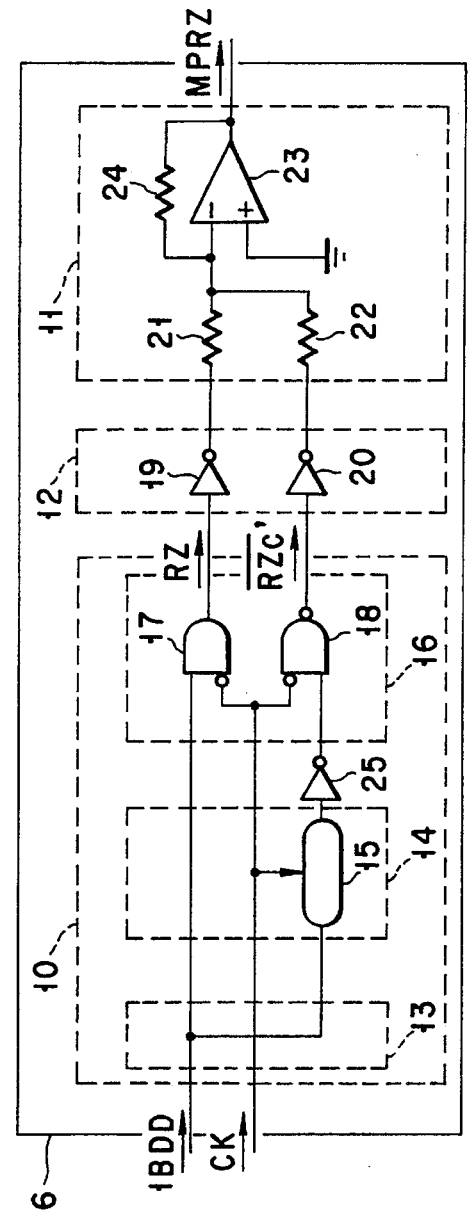
F I G. 13

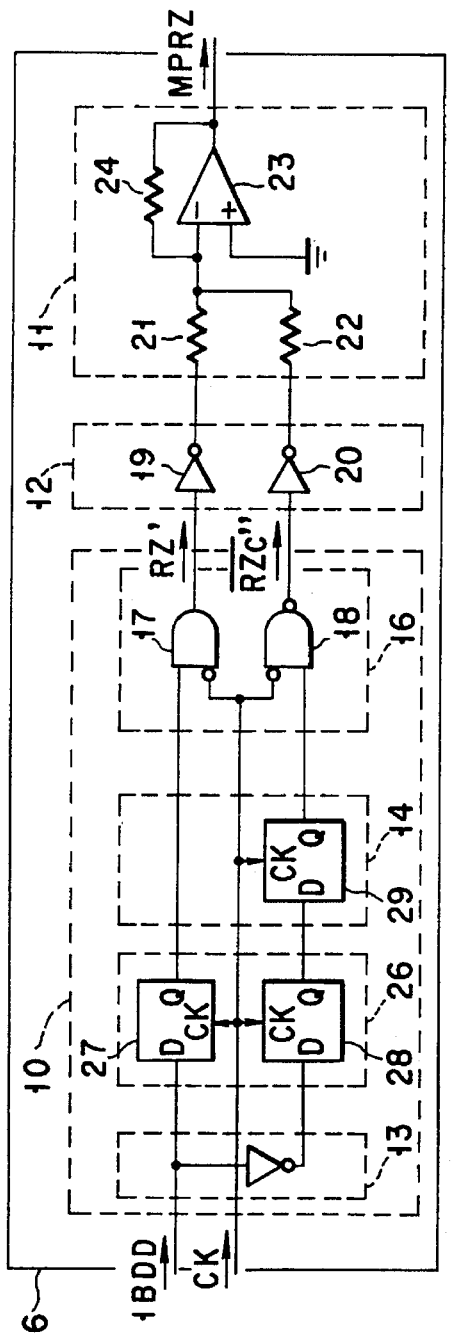
F I G. 14
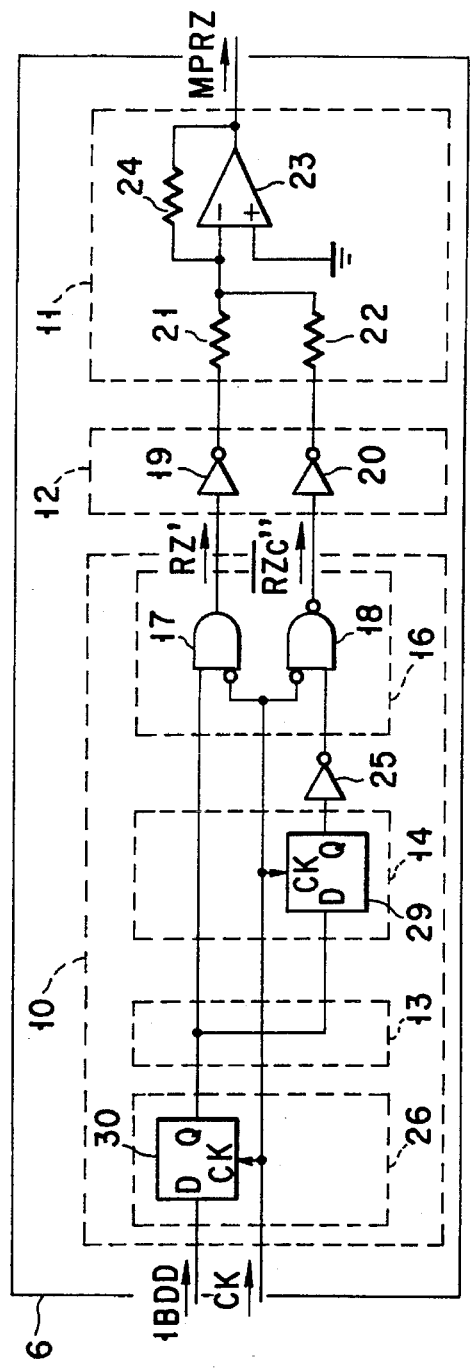
F I G. 15

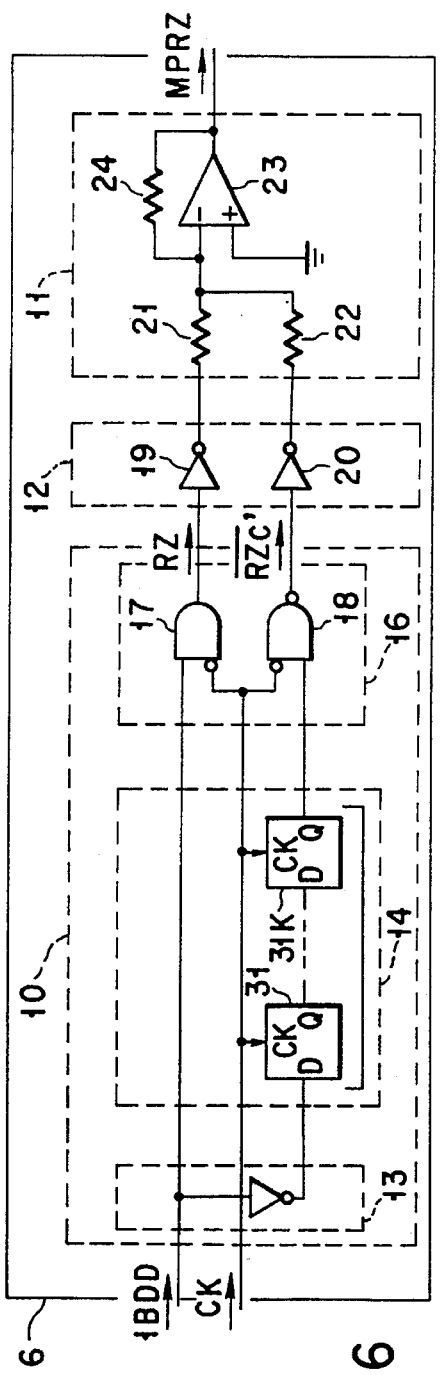
F I G. 16
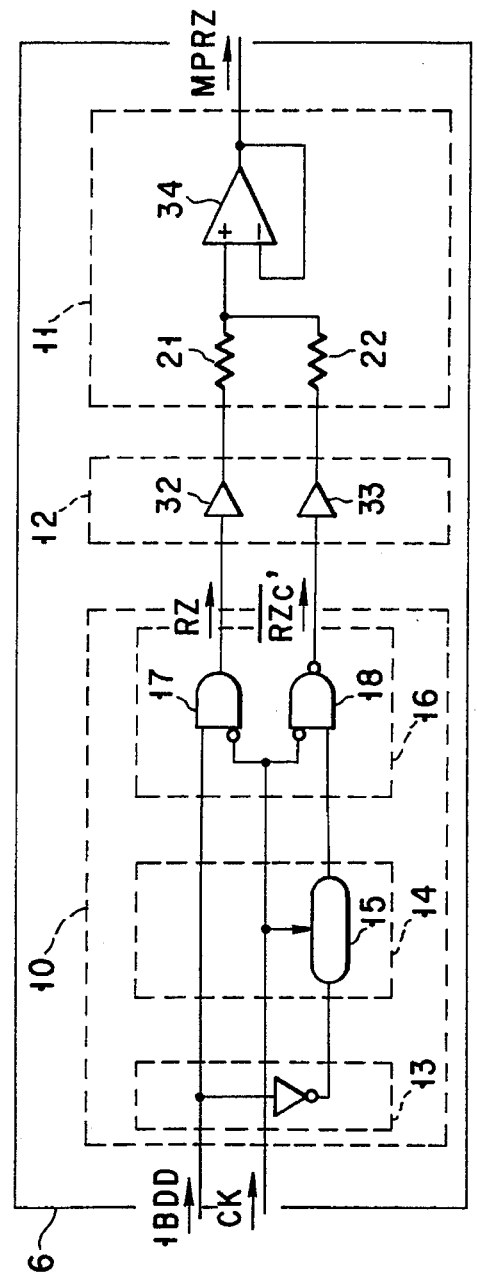
F I G. 17

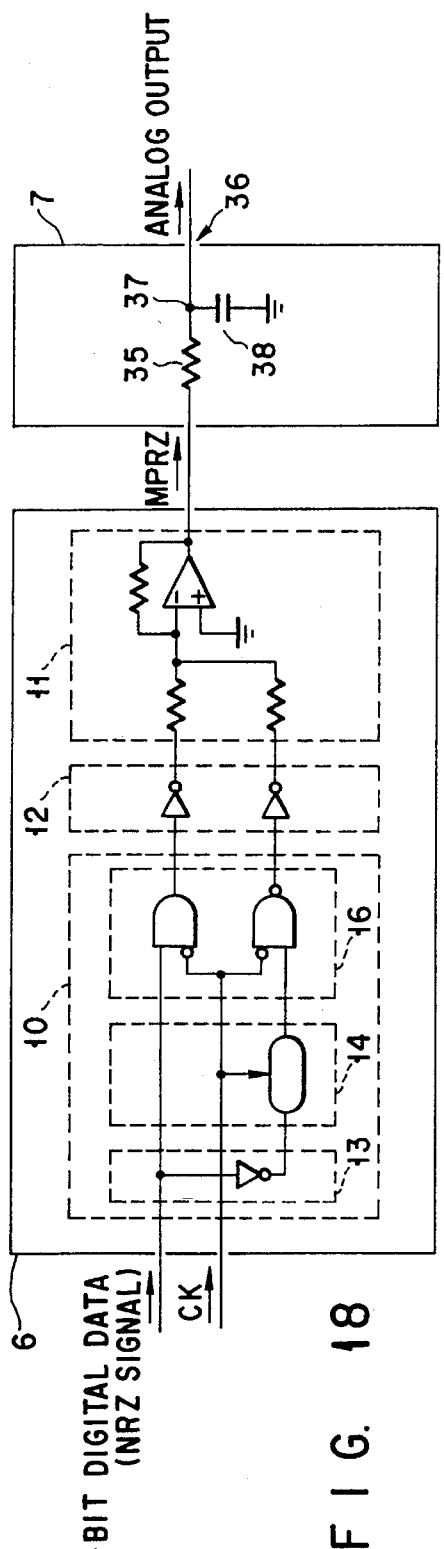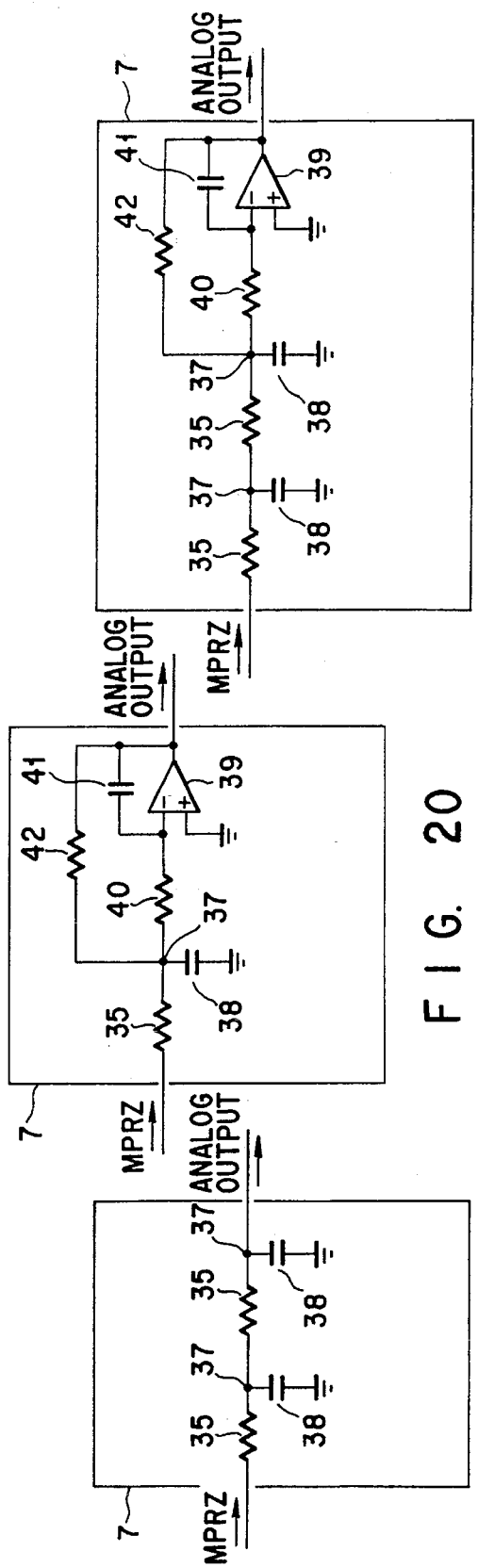
F I G. 18
F I G. 19
F I G. 20
F I G. 21

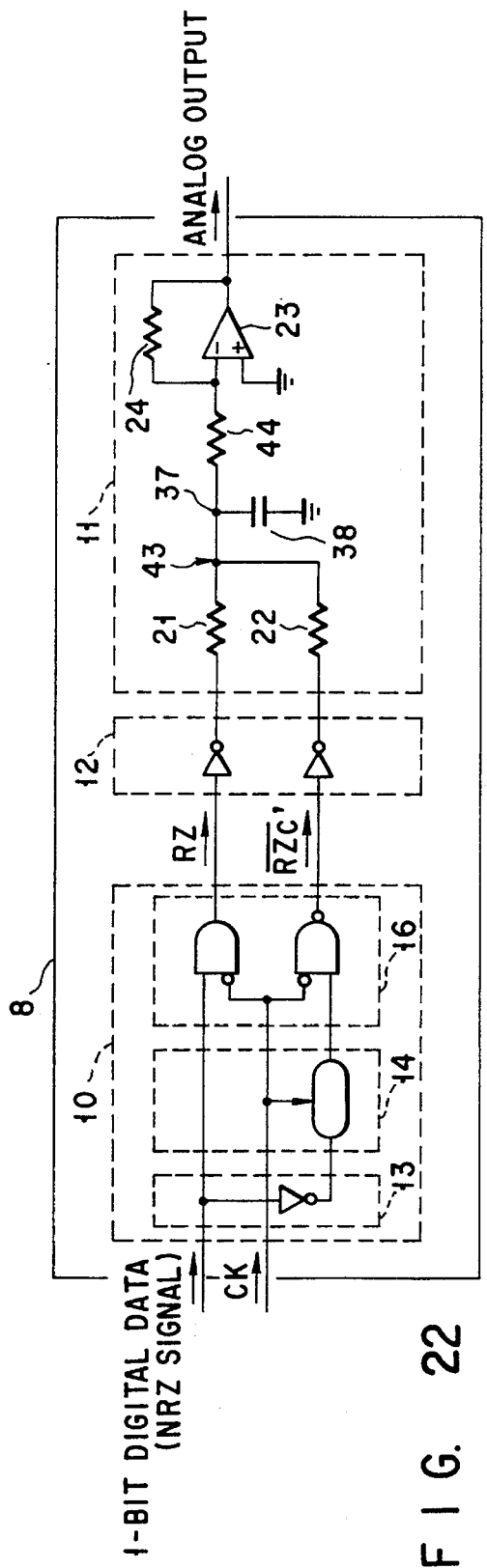
F I G. 22
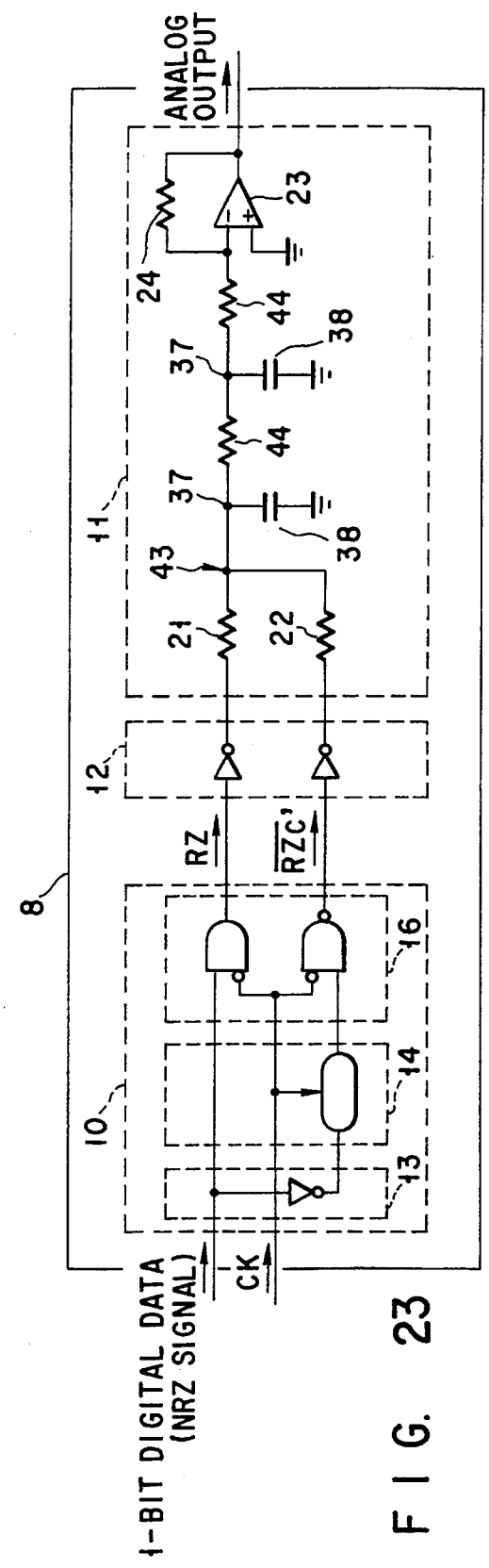
F I G. 23

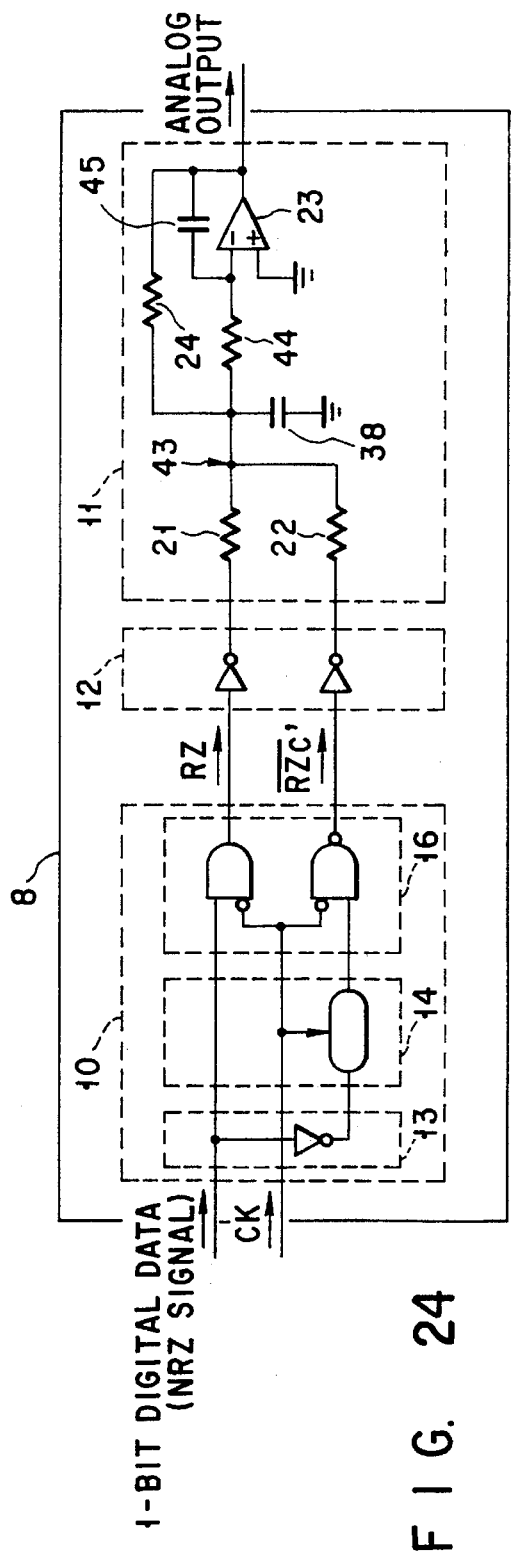
F I G. 24
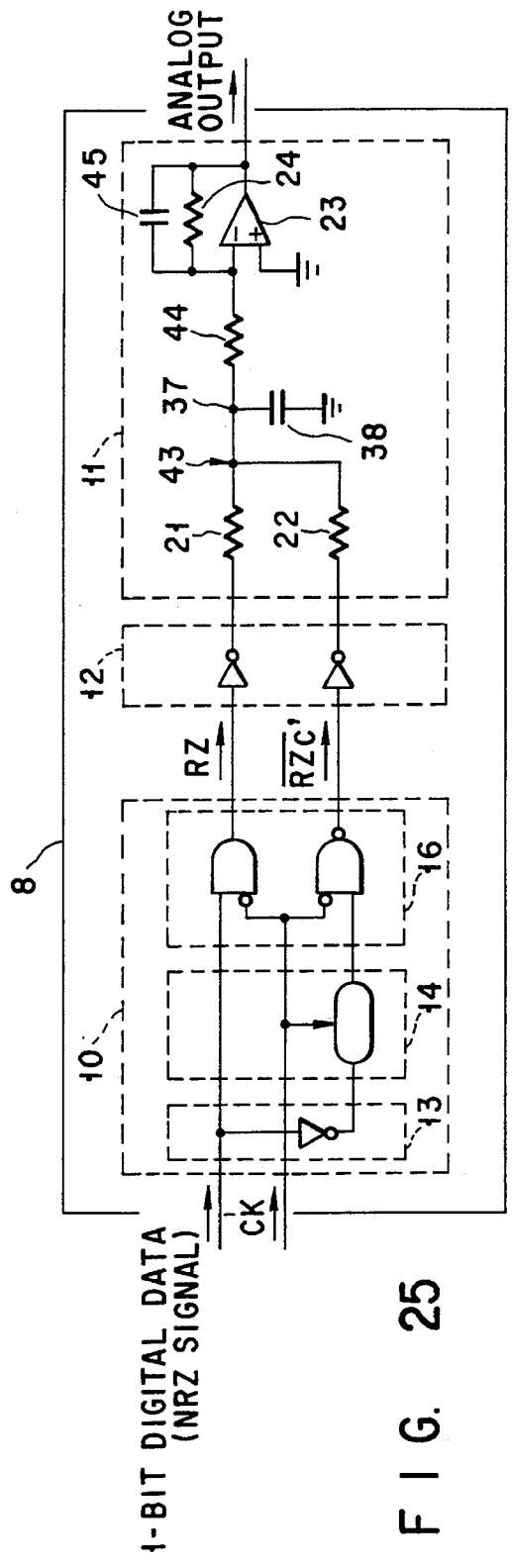
F I G. 25

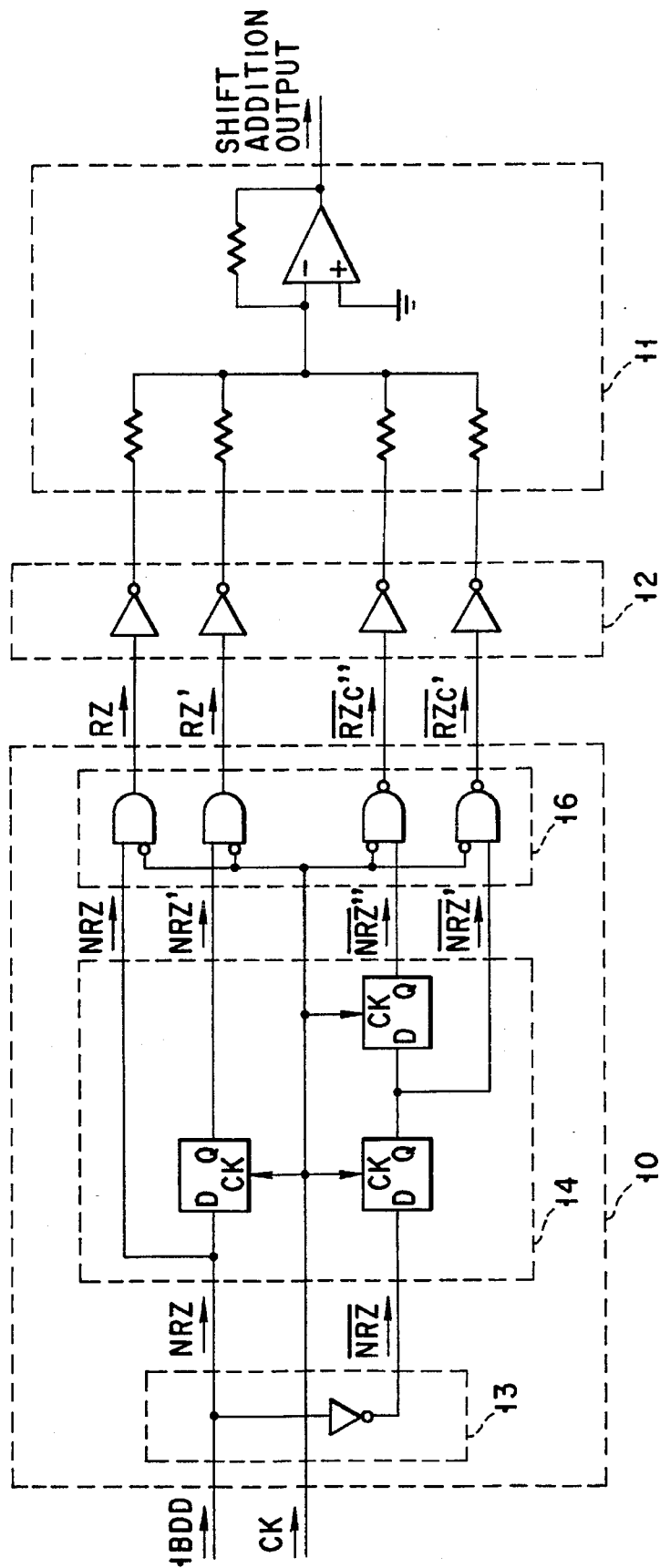
F I G. 28

1-BIT D/A CONVERSION CIRCUIT

BACKGROUND OF THE INVENTION

1. Field of the Invention

The present invention relates to a 1-bit D/A conversion circuit of an over-sampling type D/A converter.

2. Description of the Related Art

In coding an analog signal into digital data based on a sampled value, it is known from the Nyquist theorem that if a sampling frequency twice a signal frequency band fB is set, the information contained in the original signal is not lost. For this reason, a sampling frequency fs of a general D/A converter is set to be about 2.2 to 2.4 times the signal frequency band fB.

The conversion precision of a D/A converter, therefore, can be considered to be determined by a conversion bit count p (resolving power), disregarding element precision.

Recently, however, an over-sampling type D/A converter which allows high conversion precision with a small conversion bit count p has been developed and put into practice. A maximum value $(S/N)_{MAX}$ of the S/N ratio of a simple over-sampling type D/A converter is given by the following equation (1):

$$(S/N)_{MAX}=(3/2)2^{2P}\{fs/(2fB)\} \quad (1)$$

According to equation (1), the S/N ratio of the D/A converter improves by 6 dB as the bit count p is increased by one bit, and improves by 3 dB as the sampling frequency fs is doubled. It is apparent from this relationship that the degree to which the S/N ratio improves when the sampling frequency fs is quadrupled is equal to that when the bit count p is increased by one bit. In other words, the conversion precision remains the same when the bit count p is decreased by one bit every time the sampling frequency fs is quadrupled. In an over-sampling type D/A converter, therefore, sufficiently high conversion precision is obtained even with a small bit count p by setting the sampling frequency fs to be sufficiently higher than the signal frequency band fB.

Currently, in a general audio D/A converter, the sampling frequency fs is set to be 44.1 kHz, and the bit count p is set to be 16 bits. Assume that this conventional D/A converter is of an over-sampling type and the bit count p is one bit. In this case, the required sampling frequency (to be referred to as an over-sampling frequency fos hereinafter) is $47 \times 10^{12}$ Hz from equation (1) above. It is, however, difficult to realize the frequency fos of $47 \times 10^{12}$ Hz.

Under the circumstances, various methods of realizing more practical over-sampling type 1-bit D/A converters have been developed. One of such D/A converters is a D/A converter using $\Sigma\Delta$ modulation. Such a D/A converter is disclosed in Peter J. A. Naus et al., "A CMOS Stereo 16-bit D/A Converter for Digital Audio", IEEE JOURNAL OF SOLID-STATE CIRCUITS, vol sc-22. No. 3, pp. 390–394, June 1987.

An over-sampling type D/A converter using $\Sigma\Delta$ modulation will be described below.

Multi-bit digital data input at the sampling frequency fs is up-sampled first by a digital filter at a frequency two to eight times the frequency fs. Subsequently, the data is over-sampled by an interpolation filter or the like at a frequency n times (normally, n=32 to 384) the frequency fs. In this case, "n" is the sampling rate and defined as n=fos/fs.

The multi-bit digital data is input to a $\Sigma\Delta$ modulator at such an over-sampling frequency nfs (=fos) to be converted into 1-bit digital data of the over-sampling frequency nfs.

FIG. 1 shows a typical arrangement of the $\Sigma\Delta$ modulator. In the system of this modulator, if the transfer function H(z) of a loop filter is given by $$H(z)=1-(1-z^{-1})^q \quad (2)$$

then, the transfer characteristic Y(z) of this qth-order $\Sigma\Delta$ modulator can be expressed by equation (3):

$$Y(z)=X(z)+(1-z^{-1})^q \cdot E(z) \quad (3)$$

In equation (3), E(z) is the re-quantization noise generated by a 1-bit quantizer Q and assumed to normally have a flat frequency characteristic. In order to obtain the frequency characteristic of a coefficient $(1-z^{-1})^q$ of E(z), let $$z=e^{j\omega T} \quad (T=1/(nfs))$$

Then, $$(1-e^{j\omega T})^q = (j\omega T)^q$$
$$= (2\pi j f/nfs)^q \cdot (2\pi f/nfs) << 1$$

Therefore, if the signal frequency band fB is set to be sufficiently lower than the over-sampling frequency nfs, the noise is reduced in a low-frequency region, and the S/N ratio in the signal band improves by $3\times(2q+1)$ dB every time the over-sampling rate n is doubled. If, for example, a second-order $\Sigma\Delta$ modulator is used, q=2, and the S/N ratio improves by 15 dB every time the over-sampling rate n is doubled. In order to obtain conversion precision as high as that of a 16-bit D/A converter, the over-sampling rate n may be set to be about 100, which is a sufficiently practicable value.

In an over-sampling type D/A converter, in order to maximally take an advantage of a decrease in the resolving power (bit count) p owing to over-sampling, the output from the $\Sigma\Delta$ modulator is a 1-bit output. For this reason, the resolving power p of the D/A conversion circuit for converting 1-bit data into an analog signal is one bit, and the problem of a linearity error due to variations in the characteristics of elements can be solved.

The following problems, however, remain unsolved: bluntness of the waveform of a signal output from the 1-bit D/A conversion circuit, distortion caused by unwanted high-frequency components and the like, and a drop in S/N ratio due to unwanted radiation. Various attempts have been made to solve such problems.

The output (1-bit data) from the $\Sigma\Delta$ modulator is an NRZ (Non Return to Zero) signal and contains a signal component in its low-frequency region. In a 1-bit D/A converter, in order to ensure sufficiently high performance and remove unwanted high-frequency components, 1-bit data is temporarily wave-shaped into a pulse output suitable for an intended application purpose. Thereafter, unwanted high-frequency components are removed from the pulse output by an analog filter to obtain an analog signal.

A D/A converter using the RZ (Return to Zero) signal as the above pulse output is disclosed in S. Aoshima, "The design concept and application technique of the original 1 bit DAC", Radio Technique, Aieh publication Co. Ltd. in Japan, pp. 152–157, November 1990.

A D/A converter using the PRZ (Polar Return to Zero) signal is disclosed in Peter J. A. Naus et al., "A CMOS Stereo 16-bit Converter for Digital Audio", IEEE JOURNAL OF SOLID-STATE CIRCUITS, vol sc-22. No. 3, pp. 390–394, June 1987.

Such a D/A converter is also disclosed in Renee G. Lerch et al., "A Monolithic $\Sigma\Delta$ A/D and D/A Converter with Filter for Broad-Band Speech Coding", IEEE JOURNAL OF SOLID-STATE CIRCUITS, vol sc-26. No. 12, pp. 1920–1927, December 1991.

As described above, in an over-sampling type 1-bit D/A converter using ΣΔ modulation, the S/N ratio can be improved by increasing the sampling rate n. In addition, since D/A conversion is performed with a resolving power of one bit, high element precision is not required, and hence this D/A converter is suitable for an integrated circuit.

However, in the 1-bit D/A conversion circuit, of the over-sampling type 1-bit D/A converter, which is designed to convert 1-bit data into an analog signal, the problems of bluntness and distortion of the waveform of an output signal and a drop in S/N ratio due to unwanted radiation still remain unsolved.

FIG. 2 is a circuit diagram showing a 1-bit D/A conversion circuit using the NRZ signal as a pulse output.

As shown in FIG. 3, there are deviations a between an ideal waveform and the waveform of an output from a D/A conversion circuit of this type because the rising/falling speed of the output rectangular wave are finite. For the sake of simplicity, assume that the output rectangular wave rises/falls linearly, and the leading- and trailing-edge inclinations are $\Delta/t1$ and $-\Delta/t2$, respectively. In this case, owing to the deviations from this ideal waveform, a DC offset represented by the following equation is produced:

$$DC=(t2-t1)N/2$$

(N is the pulse count per second)
This offset is proportional to the pulse count per second. For this reason, as shown in FIG. 3, if digital data input to the D/A conversion circuit is a signal near 0, the DC offset increases. This is because the pulse count per unit time is large.

If the input data is a signal near qfull scale (to be referred to as FS hereinafter), since the pulse count is small, transfer characteristics like those shown in FIG. 4 are obtained. As a result, secondary distortion is produced.

This secondary distortion can be canceled if a differential scheme is employed, as shown in FIG. 5. It is, however, difficult to completely cancel the distortion because of variations in the characteristics of elements. That is, distortion remains unremoved more or less. In addition, owing to the differential scheme, the number of pins increases if the analog filter is not incorporated in an LSI. Furthermore, since the numbers of capacitors and resistor increase, the cost increases. Even if the analog filter is incorporated in an LSI, since the total number of capacitors and resistors increases, the chip cost increases.

SUMMARY OF THE INVENTION

It is the first object of the present invention to provide the first object of the present invention is to provide a 1-bit D/A conversion circuit which has no differential analog filter and which can yet generate an analog output having a sufficiently high accuracy.

It is the second object of the present invention to provide a 1-bit D/A conversion circuit which can obtain sufficiently high conversion precision even by using a device having a low sleue rate as an analog adder or an analog filter.

It is the third object of the present invention to provide a 1-bit D/A conversion circuit which can sufficiently suppress out-of-band high-frequency components by itself.

To attain this objects, in the invention a 1-bit digital data is converted into a first RZ signal and a second RZ signal complementary to the first RZ signal, the first and second RZ signals are shifted with respect to each other and then combined together.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing a typical arrangement of a ΣΔ modulator;

FIG. 6 is a block diagram showing a typical arrangement of a D/A converter to which the present invention is applied;

FIG. 12 is a timing chart showing the waveforms of inputs and outputs to/from the circuit shown in FIG. 11;

FIG. 13 is a circuit diagram showing a 1-bit D/A conversion circuit according to the third embodiment of the present invention;

FIG. 14 is a circuit diagram showing a 1-bit D/A conversion circuit according to the fourth embodiment of the present invention;

FIG. 15 is a circuit diagram showing a 1-bit D/A conversion circuit according to the fifth embodiment of the present invention;

FIG. 16 is a circuit diagram showing a 1-bit D/A conversion circuit according to the sixth embodiment of the present invention;

FIG. 17 is a circuit diagram showing a 1-bit D/A conversion circuit according to the seventh embodiment of the present invention;

FIG. 18 is a circuit diagram is a circuit diagram showing the first modification of the analog filter connected to the 1-bit D/A conversion circuit of the present invention;

FIG. 19 is a circuit diagram showing the second modification of the analog filter;

FIG. 20 is a circuit diagram showing the third modification of the analog filter;

FIG. 21 is a circuit diagram showing the fourth modification of the analog filter;

FIG. 22 is a circuit diagram showing a 1-bit D/A conversion circuit according to the eighth embodiment of the present invention;

FIG. 23 is a circuit diagram showing a 1-bit D/A conversion circuit according to the ninth embodiment of the present invention;

FIG. 24 is a circuit diagram showing a 1-bit D/A conversion circuit according to the tenth embodiment of the present invention;

FIG. 25 is a circuit diagram showing a 1-bit D/A conversion circuit according to the eleventh embodiment of the present invention;

FIG. 28 is a circuit diagram showing a 1-bit D/A conversion circuit according to an application of the present invention;

DETAILED DESCRIPTION OF THE PREFERRED EMBODIMENTS

Figure 2:
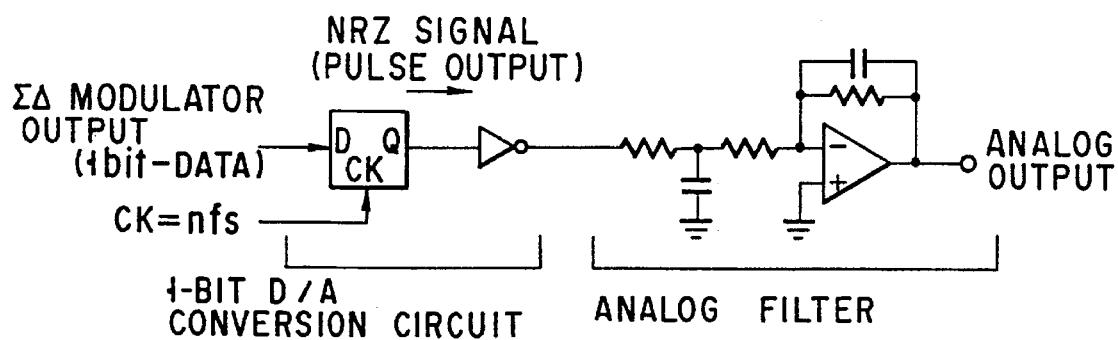
FIG. 2 is a circuit diagram showing a conventional 1-bit D/A conversion circuit using an NRZ signal.
Figure 3:
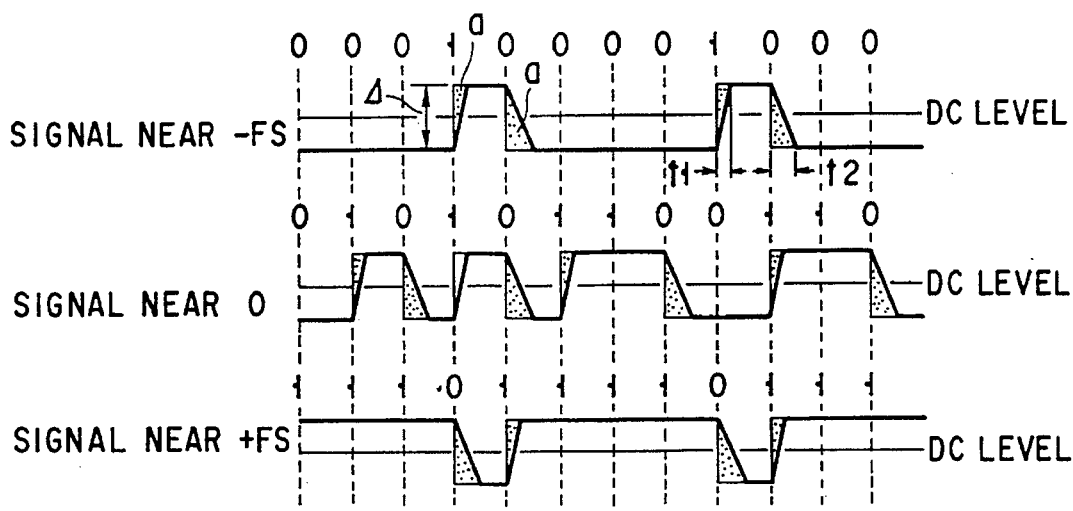
FIG. 3 is a timing chart showing the waveforms of outputs from the circuit shown in FIG. 2.
Figure 4:
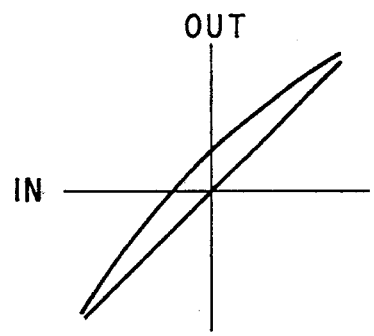
FIG. 4 is a graph showing the transfer characteristics of the circuit shown in FIG. 2.
Figure 5:
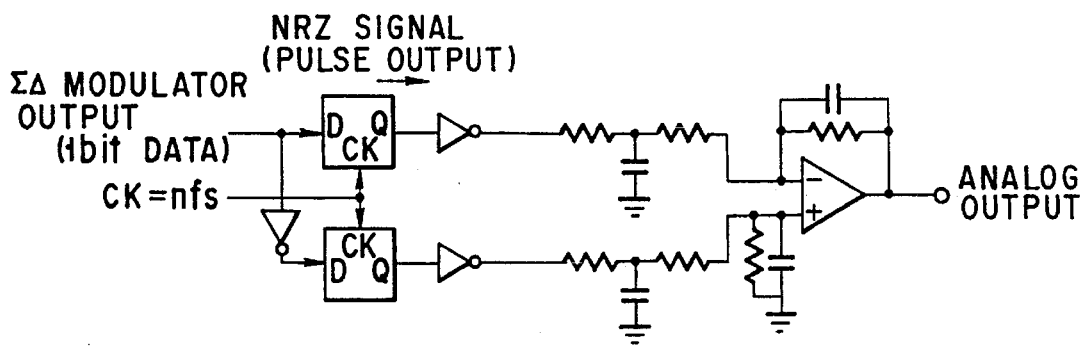
FIG. 5 is a circuit diagram showing a case wherein the circuit shown in FIG. 2 is formed into a differential type circuit.

A 1-bit D/A conversion circuit according to an embodiment of the present invention will be described below with reference to the accompanying drawings. Note that the same reference numerals denote the same parts throughout the drawings, and a repetitive description will be omitted.

FIG. 6 is a block diagram showing a typical arrangement of a D/A converter to which the present invention is applied.

As shown in FIG. 6, the D/A converter comprises circuit sections 1 and 2. The circuit section 1 receives a multi-bit digital data signal (to be referred to as an MB-DD hereinafter), converts the MB-DD into 1-bit digital data (to be referred to as a 1B-DD hereinafter), and outputs the 1B-DD obtained by conversion. The circuit section 2 converts the 1B-DD into an analog signal, and outputs the analog signal obtained by conversion.

The circuit section 1 preferably has the following arrangement.

The circuit section 1 has a digital filter 3 for receiving MB-DD sampled at a sampling frequency fs, up-sampling the MB-DD at a frequency 2–8 fs two to eight times the frequency fs, and outputting the up-sampled MB-DD. The up-sampled MB-DD is input to an interpolation filter 4. The interpolation filter 4 over-samples the up-sampled MB-DD at a frequency nfs n times (normally, n=32 to 384) the frequency fs, and outputs the over-sampled MB-DD. The over-sampled MB-DD is input to a ΣΔ modulator 5. The ΣΔ modulator 5 converts the over-sampled MB-DD into 1B-DD sampled at the frequency nfs, and outputs the 1B-DD.

The circuit section 2 preferably has the following arrangement.

The circuit section 2 has a 1-bit D/A conversion circuit 6 for receiving the 1B-DD obtained by conversion, and converting the 1B-DD into a pulse output.

The pulse output is input to an analog filter 7. The analog filter 7 converts the pulse output into an analog output, and outputs the analog output.

The D/A converter having the above arrangement belongs to an over-sampling type D/A converter. In forming such a D/A converter, the 1-bit D/A conversion circuit 6 is a block with which the present invention is especially associated. In addition, the present invention is associated with the section enclosed within a broken line frame 8 in FIG. 6. The broken line frame 8 encloses not only the 1-bit D/A conversion circuit 6 but also the analog filter 7. The reason will be clarified by the following description of several embodiments.

Figure 7:
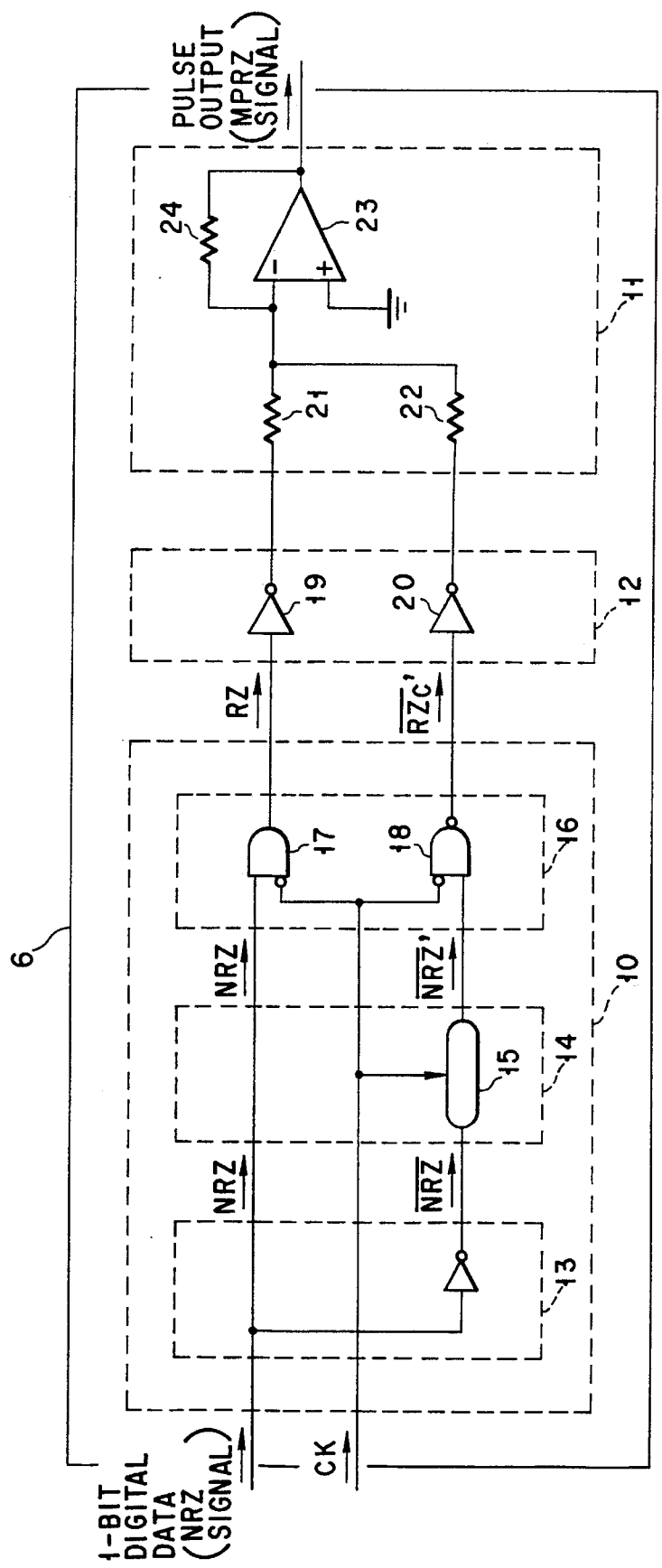
FIG. 7 is a circuit diagram showing a 1-bit D/A conversion circuit according to the first embodiment of the present invention.

FIG. 7 shows the most basic arrangement of a 1-bit D/A conversion circuit according to the present invention.

The arrangement, of this 1-bit D/A conversion circuit according to the present invention, which is designed to achieve the objects of the present invention and the principle of the circuit will be described first with reference to FIG. 7.

FIG. 7 is a circuit diagram showing the 1-bit D/A conversion circuit according to the first embodiment of the present invention.

As shown in FIG. 7, a 1-bit D/A conversion circuit 6 comprises an NRZ/RZ conversion circuit 10 and an adder circuit 11. The NRZ/RZ conversion circuit 10 receives 1-bit digital data (1B-DD) which is mainly an NRZ signal, and converts the 1B-DD into two signals, i.e., an RZ signal and an RZc (BAR) signal complementary to the RZ signal. In addition, the NRZ/RZ conversion circuit 10 outputs the RZ and RZc (BAR) signals obtained by conversion upon shifting the two signals from each other by a time corresponding to an integer multiple of the clock pulse period of a clock CK. The adder circuit 11 performs analog addition of these signals to output an improved PRZ signal (to be referred to as an MPRZ signal hereinafter). The above components constitute the basic arrangement. FIG. 7, however, shows an example of the arrangement including a buffer circuit 12 for amplifying the RZ signal and the RZc (BAR) signal. Although the buffer circuit 12 need not always be included, it is more preferable that the RZ signal and the RZc (BAR) signal be input to the adder circuit 11 after being amplified by the buffer circuit 12.

More specifically, the NRZ/RZ conversion circuit 10 has the following arrangement to shift the RZ and RZc (BAR) signals, obtained by conversion, from each other by a time corresponding to an integer times of the clock pulse period and output the two signals.

The NRZ/RZ conversion circuit 10 has a dividing circuit 13 for receiving 1B-DD (NRZ signal), dividing the 1B-DD into the NRZ signal and the NRZ (BAR) signal obtained by inverting the NRZ signal, and outputting the divided NRZ and NRZ (BAR) signals. The NRZ and NRZ (BAR) signals are input to a delay circuit 14. The delay circuit 14 outputs one of the NRZ and NRZ (BAR) signals upon delaying it by a time corresponding to an integer times of the clock pulse period. FIG. 7 shows a case wherein the NRZ (BAR) signal is output after being delayed by a time corresponding to an integer multiple of the clock pulse period.

The delay circuit 14 has a shift circuit 15. The clock CK having the frequency nfs is input to the shift circuit 15. The shift circuit 15 detects the clock CK, and delays the NRZ (BAR) signal input thereto by a time corresponding to k times (k is an integer not less than 1) the clock pulse period, i.e., a time corresponding to one pulse, two pulses, three pulses, . . . , of the clock CK. In this manner, the shift circuit 15 generates the NRZ (BAR)' signal (the symbol """ indicates that the signal is delayed) delayed from the NRZ signal by an integer times of the clock pulse period, and outputs the delayed signal. Note that the shift circuit 15 may be constituted by circuits such as a D-flip-flop and a shift register.

The NRZ and NRZ (BAR)' signals are input to a signal generator 16. The signal generator 16 has a 2-input type AND gate 17 and 2-input type NAND gate 18. 1B-DD (NRZ signal) is input to one input terminal of the AND gate 17, and a clock (inverted clock) obtained by inverting the clock CK is input to the other input terminal of the AND gate 17. The AND gate 17 calculates the logical AND of the 1B-DD and the inverted clock to generate an RZ signal, and outputs it.

The NRZ (BAR)' signal is input to one input terminal of the NAND gate 18, and a clock (inverted clock) obtained by inverting the clock CK is input to the other input terminal of the NAND gate 18. The NAND gate 18 calculates and inverts the logical AND of the NRZ (BAR)' signal and the inverted clock to generate an RZc (BAR) signal complementary to the RZ signal, and outputs it.

The RZ and RZc (BAR)' signals are input to the buffer circuit 12. The RZ signal is amplified by an inverter 19. The RZc (BAR)' signal is amplified by an inverter 20.

The amplified RZ and RZc (BAR)' signals are input to the adder circuit 11. The adder circuit 11 has an input resistor 21, an input resistor 22, and an inverting amplifier 23. The RZ signal is input to one terminal of the input resistor 21, and the RZc (BAR)' signal is input to one terminal of the input resistor 22. The other terminal of the input resistor 21 is coupled to the other terminal of the input resistor 22. This node is connected to the inverting input terminal (−) of the inverting amplifier 23. For this reason, both the RZ and RZc (BAR)' signals are input to the inverting input terminal (−) of the inverting amplifier 23. The non-inverting input terminal (+) of the inverting amplifier 23 is grounded. Therefore, the inverting amplifier 23 generates a ternary MPRZ signal from the RZ and RZc (BAR)' signals, and outputs it as a pulse output. Note that a resistor 24 connecting the output terminal and inverting input terminal (−) of the inverting amplifier 23 to each other is a feedback resistor.

Figure 8:
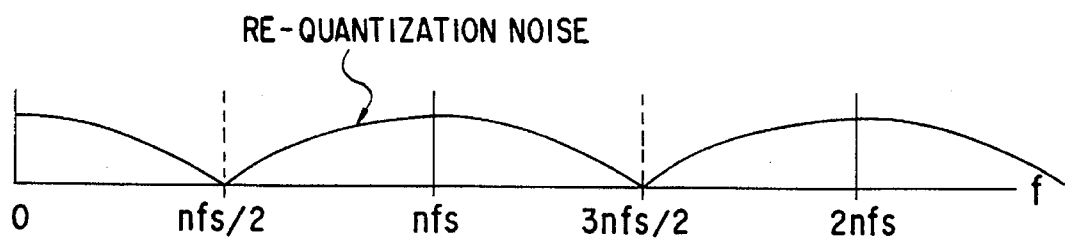
FIG. 8 is a diagram representing the frequency characteristic of a shifting-adding system.

FIG. 8 is a diagram representing the frequency characteristic of a shifting-adding system.

Figure 9:
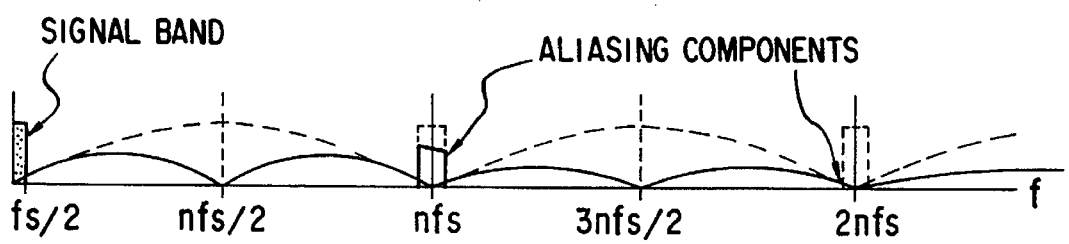
FIG. 9 is a chart showing the frequency characteristic of an actual pulse output from the circuit shown in FIG. 7.

As shown in FIG. 9, an impulse repeats the same waveform at a period nfs. However, re-quantization noise exhibits an energy distribution having a peak at the period nfs and a zero at a position corresponding to a half of the period nfs, i.e., at nfs/2 or 3nfs/2. This is basically because RZ signals shifted from each other by a time corresponding to an integer multiple of the clock pulse period are added. On the basis of such a characteristic, the frequency characteristic of an MPRZ signal having a pulse waveform, which is an actual output, are obtained. FIG. 9 shows this frequency characteristic.

As shown in FIG. 9, since re-quantization noise becomes zero at a period half the period nfs, i.e., nfs/2, the energy of the noise decreases. Therefore, the re-quantization noise is reduced.

In addition, according to the present invention, since the RZ signal and the RZc (BAR) signal complementary to the RZ signal are added to each other after being shifted from each by a time corresponding to an integer multiple of the clock pulse period, the following effect can be obtained.

Figure 10:
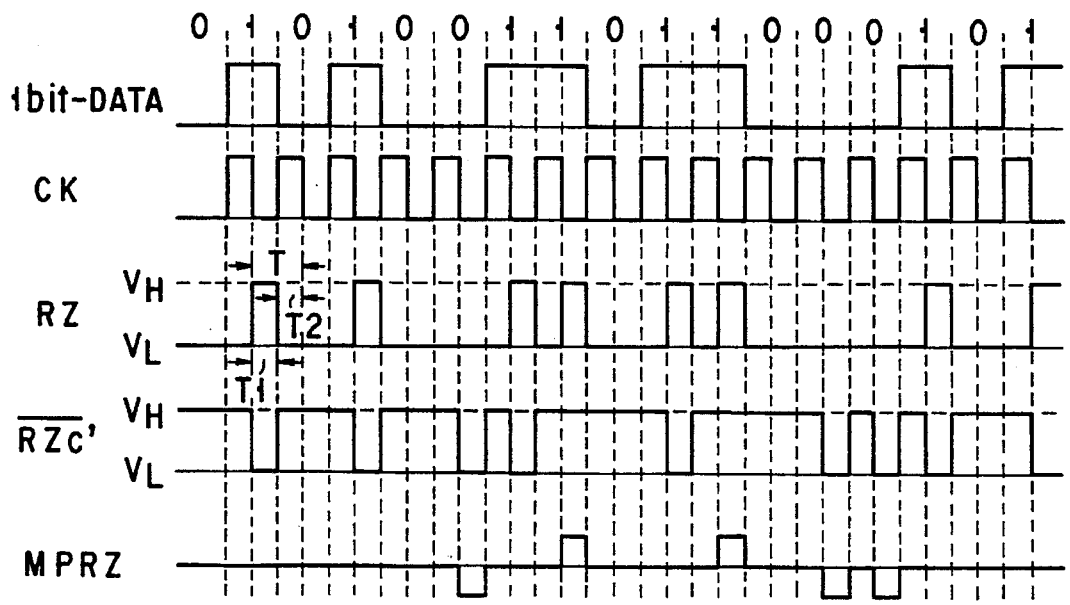
FIG. 10 is a timing chart showing the waveforms of inputs and outputs to/from the circuit shown in FIG. 7.

As shown in FIG. 10, the pulse count of the MPRZ signal is small. This effect, i.e., a decrease in pulse count, is enhanced especially when the signal value is near 0. Therefore, unwanted radiation can be suppressed.

As described above, in the 1-bit D/A conversion circuit 6 having the arrangement shown in FIG. 7, the two effects, i.e., a reduction in re-quantization noise and suppression of unwanted radiation, can be obtained at once. Therefore, the 1-bit D/A conversion circuit according to the present invention can sufficiently suppress unwanted high-frequency components by itself.

Figure 11:
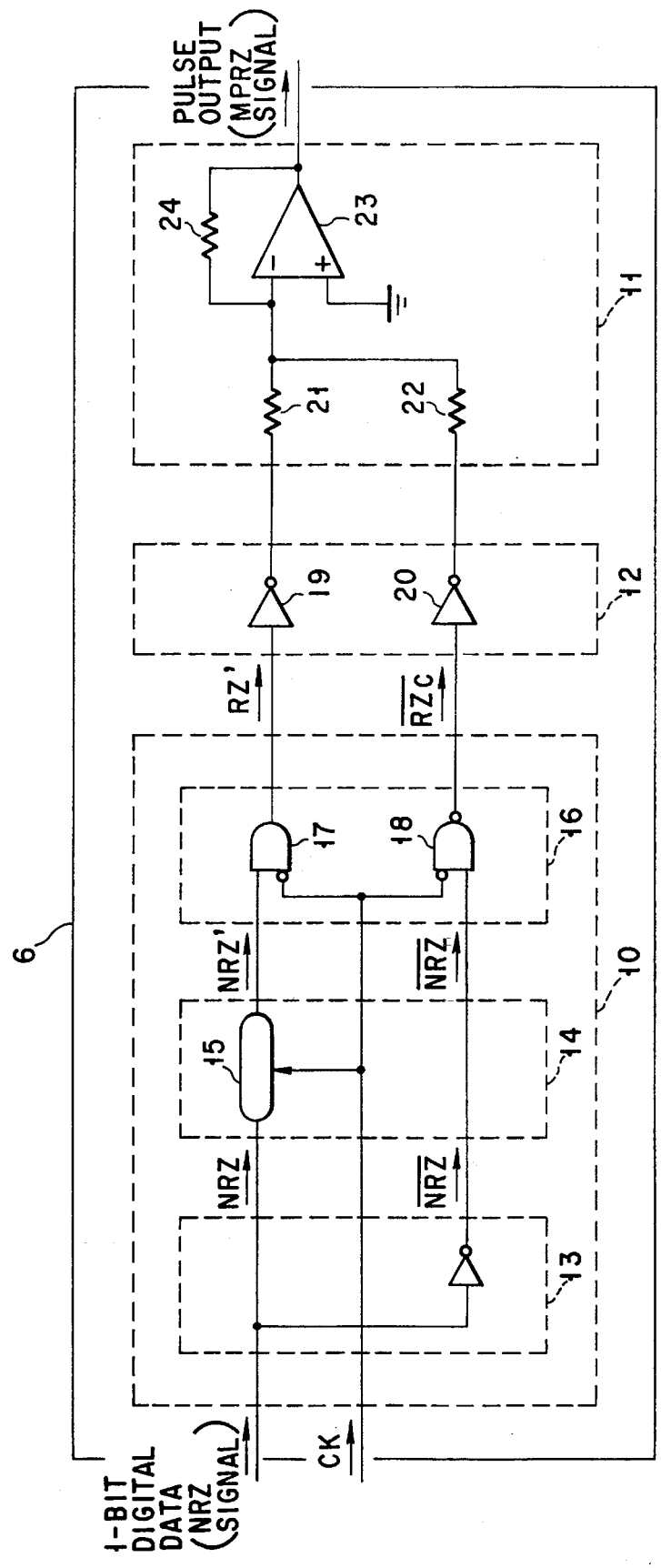
FIG. 11 is a circuit diagram showing a 1-bit D/A conversion circuit according to the second embodiment of the present invention.

This effect can also be obtained by the arrangement shown in FIG. 11.

FIG. 11 is a circuit diagram showing a 1-bit D/A conversion circuit according to the second embodiment of the present invention.

As shown in FIG. 11, the conversion circuit of the second embodiment is different from that of the first embodiment in that a shift circuit 15 is arranged in a current path for transferring the NRZ signal.

A frequency characteristic obtained when an output from a 1-bit D/A conversion circuit 6 in FIG. 11 is considered as an impulse is the same as that in the 1-bit D/A conversion circuit 6 in FIG. 7. This is because the 1-bit D/A conversion circuit 6 in FIG. 11 also adds RZ signals shifted from each other by a time corresponding to an integer multiple of the clock pulse period.

FIG. 12 shows input and output waveforms obtained when a delay time corresponding to one clock is set in the circuit shown in FIG. 11.

The pulse waveform of the MPRZ signal shown in FIG. 12 is the same as that of the MPRZ signal shown in FIG. 10.

As is apparent from the above description, since the circuit shown in FIG. 11 performs the same operation as that of the circuit shown in FIG. 7, the same effects as those obtained by the circuit in FIG. 7 can be obtained.

The function of the NRZ/RZ conversion circuit 10 in FIGS. 7 and 11 can be summarized as follows from the viewpoint of the RZ, RZc (BAR)', RZ', and RZc (BAR) signals shown in FIGS. 10 and 12.

1B-DD (NRZ signal) sampled at a period T is input to the NRZ/RZ conversion circuit 10. When the input 1B-DD is at "1" level, a predetermined voltage $V_H$ is generated for a predetermined time T1 within the range of the period T, and a predetermined voltage $V_L$ is generated for the remaining time T-T1 (=T2). When the 1B-DD is at "0" level, the predetermined voltage $V_L$ is generated for all the time of the period T. The signal generated and output under these conditions is the RZ signal.

In addition, when 1B-DD input to the NRZ/RZ conversion circuit 10 is at "0" level, the predetermined voltage $V_L$ is generated for a predetermined time T1 within the range of the period T, and the predetermined voltage $V_H$ is generated for the remaining time T-T1 (=T2). When the 1B-DD is at "1" level, the predetermined voltage $V_H$ is generated for all the time of the period T. The signal generated and output under these conditions is the RZc (BAR) signal.

The NRZ/RZ conversion circuit 10 delays one of the RZ and RZc (BAR) signals having such a relationship by a time corresponding to k times (k is an integer not less than 1) the period T, thus outputting the RZ and RZc (BAR) signals upon shifting them from each other.

Embodiments associated with various modifications of the 1-bit D/A conversion circuit of the present invention will be described next on the basis of the conversion circuit 6 shown in FIG. 7. Note that each embodiment described below can be applied to the conversion circuit 6 shown in FIG. 11. In addition, the respective embodiments may be combined with each other.

FIG. 13 is a circuit diagram showing a 1-bit D/A conversion circuit according to the third embodiment of the present invention.

As shown in FIG. 13, a conversion circuit 6 according to the third embodiment is different from the conversion circuit 6 according to the first embodiment in that a dividing circuit 13 includes no inverter, and an inverter 25 is connected to the output terminal of a delay circuit 14.

Even with this arrangement, the same input/output relationship as that shown in FIG. 10 can be obtained.

FIG. 14 is a circuit diagram showing a 1-bit D/A conversion circuit according to the fourth embodiment of the present invention.

As shown in FIG. 14, a conversion circuit 6 according to the fourth embodiment of the present invention is different from the conversion circuit 6 according to the first embodiment in that a wave-shaping circuit 26 is arranged between a dividing circuit 13 and a delay circuit 14.

In general, 1B-DD includes noise, clock jitter, glitch, and the like and hence has an irregular waveform. In the conversion circuit according to the fourth embodiment, the distorted waveform can be shaped into a regular waveform by the wave-shaping circuit 26. For this reason, the precision of an MPRZ signal is improved.

The wave-shaping circuit 26 has a D-flip-flop (to be referred to as a D-FF hereinafter) 27 arranged in a current path for transferring the NRZ signal, and a D-FF 28 arranged in a current path for transferring the NRZ (BAR) signal. The irregular waveform of 1B-DD is wave-shaped by the D-FFs 27 and 28 each using a pure clock CK having little jitter.

When D-FFs are used for the wave-shaping circuit 26, a D-FF 29 can be easily used, as a shift circuit, for the delay circuit 14 connected to the output terminal of the wave-shaping circuit 26.

As shown in FIG. 14, the clock CK used by the D-FFs 27 and 28 is input to the clock terminal (CK) of the D-FF 28. An output terminal Q of the D-FF 28 is connected to an input terminal D of the D-FF 29. With this connection, the connected state of the D-FFs 28 and 29 become the same as that of a general shift register.

Assume that each of the D-FFs 28 and 27 performs an up-edge trigger (or down-edge trigger). In this case, since the D-FFs 28 and 27 operate on the same clock, the timings of their output operations can be considered to be the same. If the D-FF 29 also performs an up-edge trigger (or down-edge trigger), the timing of the output operation of the D-FF 29 is delayed from that of the D-FF 27 by a time corresponding to one clock.

FIG. 15 is a circuit diagram showing a 1-bit D/A conversion circuit according to the fifth embodiment of the present invention.

As shown in FIG. 15, a conversion circuit 6 according to the fifth embodiment is different from the conversion circuit 6 according to the first embodiment in that a dividing circuit 13 includes no inverter, an inverter 25 for obtaining the NRZ (BAR) signal is connected to the output terminal of a delay circuit 14, and a wave-shaping circuit 26 is arranged between an input terminal for receiving 1B-DD and a dividing circuit 13.

In the conversion circuit according to the fifth embodiment, since the wave-shaping circuit 26 is arranged, the irregular waveform of 1B-DD can be wave-shaped into a regular waveform.

A D-FF 30 is used for the wave-shaping circuit 26. A clock CK used by the D-FF 30 is commonly used by a D-FF 29 of the delay circuit 14. Therefore, similar to the fourth embodiment, a shift register can be easily formed by connecting an output terminal Q of the D-FF 30 to an input terminal D of the D-FF 29.

FIG. 16 is a circuit diagram showing a 1-bit D/A conversion circuit according to the sixth embodiment of the present invention.

As shown in FIG. 16, a conversion circuit 6 according to the sixth embodiment is different from the conversion circuit 6 according to the first embodiment in that k D-FFs 31 to 31k constituting the shift circuit of a delay circuit 14 are cascade-connected to each other.

In the conversion circuit 6 according to the sixth embodiment, since the D-FFs 31 to 31k are cascade-connected, the delay amount can be set to be an integer multiple of a period T, i.e., one clock, two clocks, three clocks, ..., k clocks.

FIG. 17 is a circuit diagram showing a 1-bit D/A conversion circuit according to the seventh embodiment of the present invention.

As shown in FIG. 17, a conversion circuit 6 according to the seventh embodiment is different from the conversion circuit 6 according to the first embodiment in that non-inverting buffers 32 and 33 are arranged on the amplification stage of a buffer circuit 12, and a non-inverting amplifier 34 is used as the operational amplifier of an adder circuit 11 so as not to invert the signal level of an MPRZ signal.

In the conversion circuit 6 according to the seventh embodiment, the signal level and waveform of the MPRZ signal output from the adder circuit 11 are the same as those of the MPRZ signal output from the adder circuit 11 in the first embodiment.

Embodiments associated with an analog filter for converting the MPRZ signal output from the 1-bit D/A conversion circuit into an analog signal output will be described next.

FIG. 18 is a circuit diagram showing an analog filter 7 connected to the 1-bit D/A conversion circuit according to the present invention.

As shown in FIG. 18, the analog filter 7 is constituted by a resistor 35 having one terminal for receiving the MPRZ signal and the other terminal connected to an output terminal 36, and a capacitor 38 having one electrode connected to the other terminal of the resistor 35 and the other electrode grounded. The node between the capacitor 38 and the resistor 35 is an AC ground point. In the first modification, a first-order low-pass filter is constituted by one capacitor (passive filter) 38. When the MPRZ signal passes through such a low-pass filter, unwanted high-frequency components are removed from the signal. The MPRZ signal has a waveform on the way from a digital waveform to an analog waveform. As a result, the MPRZ signal is converted into a signal (analog signal output) having an analog waveform.

FIG. 19 is a circuit diagram showing the second modification of the analog filter 7 connected to the 1-bit D/A conversion circuit according to the present invention.

As shown in FIG. 19, a second-order low-pass filter is constituted by two capacitors 38, each identical to the capacitor 38 in FIG. 18.

FIG. 20 is a circuit diagram showing the third modification of the analog filter 7 connected to the 1-bit D/A conversion circuit according to the present invention.

As shown in FIG. 20, the third modification includes an inverting amplifier 39 as well as the capacitor 38 shown in FIG. 18. In addition, this modification includes a resistor 40 connected between the inverting input terminal of the inverting amplifier 39 and a resistor 35, and a capacitor 41 connecting the inverting input terminal and output terminal of the inverting amplifier 39 to each other. The inverting amplifier 39, the resistor 40, and the capacitor 41 constitute an integration circuit. Therefore, the third modification is a second-order low-pass filter. Note that a resistor 42 is a feedback resistor.

FIG. 21 is a circuit diagram showing the fourth modification of the analog filter 7 connected to the 1-bit D/A conversion circuit according to the present invention.

As shown in FIG. 21, in the fourth modification, two capacitors 38, each identical to the capacitor 38 shown in FIG. 18, are coupled to one integration circuit identical to the one shown in FIG. 20. Therefore, the fourth modification is a third-order low-pass filter.

By connecting such an analog filter 7 to the output terminal of the 1-bit D/A conversion circuit 6, the MPRZ signal output from the conversion circuit 6 can be converted into an analog signal. In this case, the conversion circuit 6 and the analog filter 7 may be integrated. Alternatively, the analog filter 7 may be constituted by an independent integrated circuit, and the input terminal of the analog filter 7 and the output terminal of the conversion circuit 6 may be connected to each other on a circuit board.

Embodiments associated with various forms, of the 1-bit D/A conversion circuit according to the present invention, which are more suitable for practical applications and the formation of integrated circuits will be described next. In this case, the forms more suitable for practical applications and the formation of integrated circuits are forms in which especially the adder circuit 11 itself is designed to have the function of an analog filter, and the conversion circuit 6 and the analog filter 7 are integrated. This integrated state is indicated by the block 8 in FIG. 6.

FIG. 22 is a circuit diagram showing a 1-bit D/A conversion circuit according to the eighth embodiment of the present invention.

As shown in FIG. 22, an adder circuit 11 has a capacitor 38 having one electrode connected to a line connecting a resistor node 43 and an input resistor 44 to each other, and the other electrode grounded. The node between the capacitor 38 and the input resistor 44 is an AC ground point 37. Therefore, potential signals appearing at the resistor node 43 are sorted into a signal which can pass through the AC ground point 37 and a signal which cannot pass the AC ground point 37 depending on the capacitance of the capacitor 38. When a potential signal passes through such a low-pass filter, unwanted high-frequency components are removed from the signal, and the resultant signal is input to the inverting input terminal of an inverting amplifier 23. The inverting amplifier 23 outputs a signal (analog signal output) having an analog waveform corresponding to the input signal.

In this embodiment, the adder circuit 11 has only one capacitor (passive filter) 38. Therefore, the adder circuit 11 has a first-order low-pass filter.

Since the capacitor 38 can be a MOS capacitance, it is easy to fabricate the 1-bit D/A conversion circuit and the analog filter in the form of an integrated circuit.

FIG. 23 is a circuit diagram showing a 1-bit D/A conversion circuit according to the ninth embodiment of the present invention.

As shown in FIG. 23, an adder circuit 11 has two capacitors 38, each identical to the capacitor 38 shown in FIG. 22. Therefore, the adder circuit 11 shown in FIG. 23 has a second-order low-pass filter.

FIG. 24 is a circuit diagram showing a 1-bit D/A conversion circuit according to the tenth embodiment of the present invention.

As shown in FIG. 24, an adder circuit 11 has not only a capacitor 38 identical to the one shown in FIG. 22 but also a capacitor 45 coupling the inverting input terminal and output terminal of an inverting amplifier 23 to each other. Therefore, the adder circuit 11 shown in FIG. 24 has a second-order low-pass filter.

FIG. 25 is a circuit diagram showing a 1-bit D/A conversion circuit according to the eleventh embodiment of the present invention.

As shown in FIG. 25, an adder circuit 11 has one capacitor 38 and one capacitor 45. Therefore, the adder circuit 11 shown in FIG. 25 has a second-order low-pass filter, similar to the adder circuit 11 shown in FIG. 24. The adder circuit 11 shown in FIG. 25 is different from the adder circuit 11 shown in FIG. 24 in that a feedback resistor 24 is arranged between the output terminal and inverting input terminal of an inverting amplifier 23.

Figure 26:
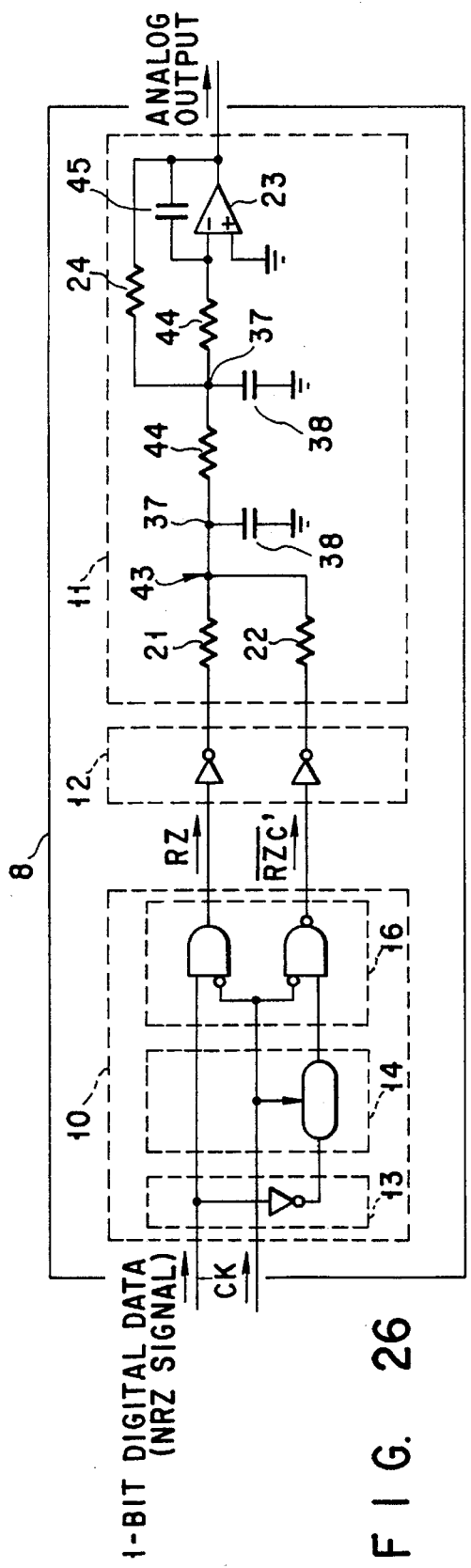
FIG. 26 is a circuit diagram showing a 1-bit D/A conversion circuit according to the twelfth embodiment of the present invention.

FIG. 26 is a circuit diagram showing a 1-bit D/A conversion circuit according to the twelfth embodiment of the present invention.

As shown in FIG. 26, an adder circuit 11 has two capacitors 38 and one capacitor 45 identical to the one shown in FIG. 24. Therefore, the adder circuit 11 shown in FIG. 26 has a third-order low-pass filter.

Figure 27:
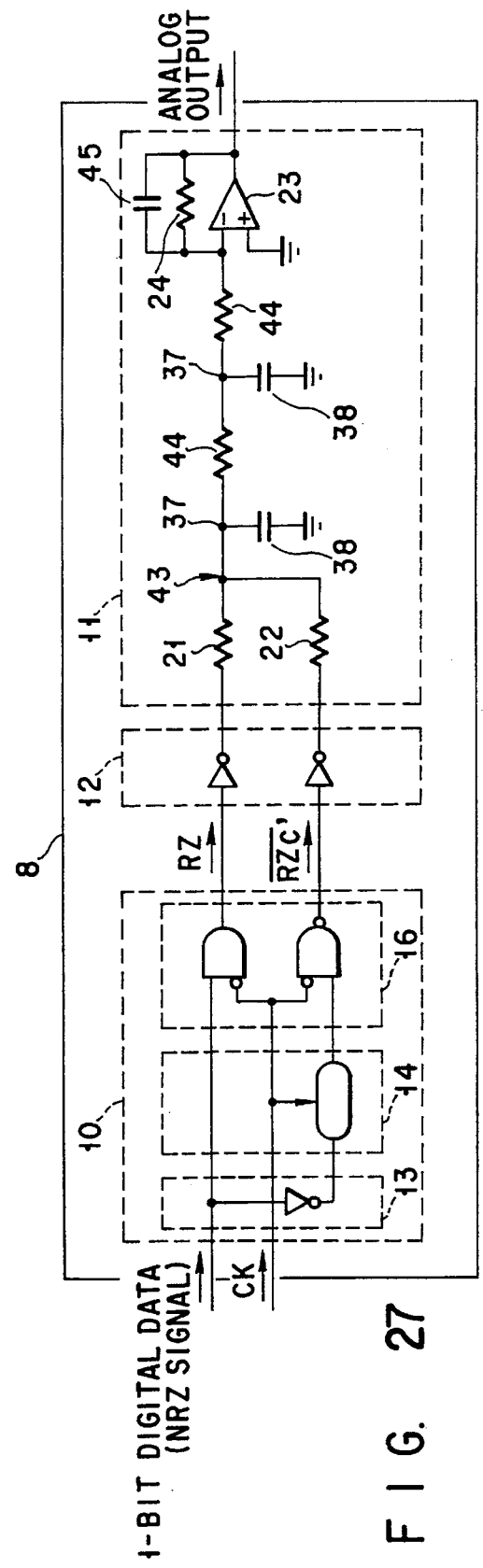
FIG. 27 is a circuit diagram showing a 1-bit D/A conversion circuit according to the thirteenth embodiment of the present invention.

FIG. 27 is a circuit diagram showing a 1-bit D/A conversion circuit according to thirteenth embodiment of the present invention.

As shown in FIG. 27, an adder circuit 11 has two capacitors 38 and one capacitor 45 identical to the one shown in FIG. 25. Therefore, the adder circuit 11 shown in FIG. 27 has a third-order low-pass filter.

An application of a 1-bit D/A conversion circuit using an MPRZ signal will be described next.

FIG. 28 is a circuit diagram showing a 1-bit D/A conversion circuit according to an application of the present invention.

As shown in FIG. 28, in the conversion circuit according to this application, an adder circuit 11 performs analog addition of the MPRZ signal and an MPRZ' signal which has the same characteristics as those of the MPRZ signal and is delayed therefrom by a time corresponding to an integer multiple of the clock period.

Four signals are required to generate the MPRZ signal and the MPRZ' signal. In order to generate these four signals, a delay circuit 14 has a function of dividing each of NRZ and NRZ (BAR) signals into two signals, i.e., two NRZ signals and two NRZ (BAR) signals. Furthermore, the delay circuit 14 delays these signals to output, for example, the NRZ signal, the NRZ' signal, the NRZ (BAR)' signal, and NRZ (BAR)" signal. An RS signal is formed from the NRZ signal. An RZ' signal is formed from the NRZ' signal. Similarly, RZc (BAR)' and RZc (BAR)" signal are respectively formed from the NRZ (BAR)' and NRZ (BAR)" signals.

An MPRZ signal is obtained by performing analog addition of the RZ and RZc (BAR)' signals. An MPRZ' signal is obtained by performing analog addition of the RZ' and RZc (BAR)" signals.

In the adder circuit 11 shown in FIG. 28, the four signals, i.e., the RZ, RZc (BAR)', RZ', and RZc (BAR)" signals, are subjected to analog addition at once. As a result, analog addition of the MPRZ and MPRZ' signals is performed. Thereafter, the shift addition output is output.

Figure 29:
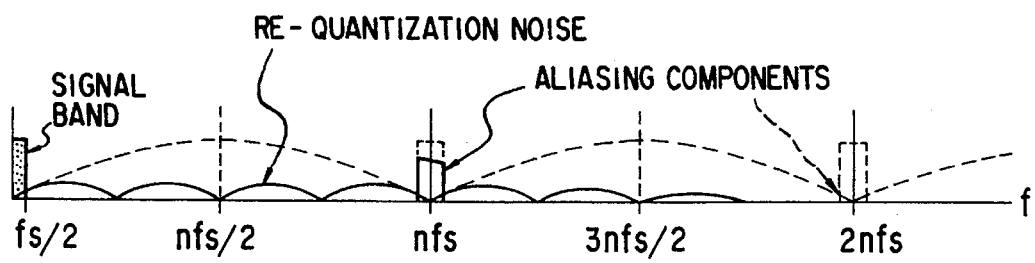
FIG. 29 is a chart showing the frequency characteristic of a pulse output from the circuit shown in FIG. 28.
Figure 30:
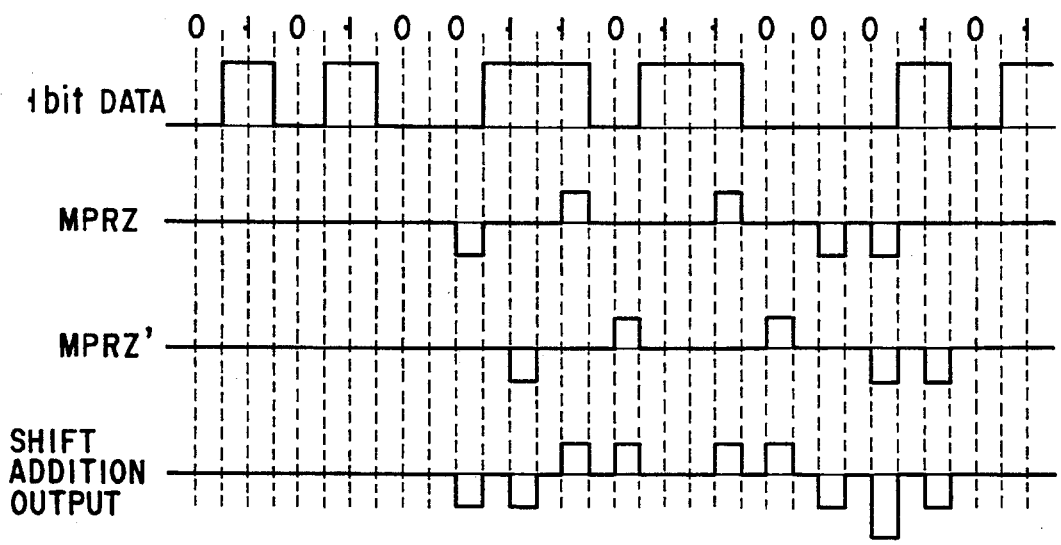
FIG. 30 is a timing chart showing the waveforms of input and outputs to/from the circuit shown in FIG. 28.

FIG. 29 shows the frequency characteristics of the conversion circuit in FIG. 28. FIG. 30 shows the waveforms of input and output signals in the conversion circuit.

As shown in FIG. 29, in the conversion circuit shown in FIG. 28, the re-quantization noise can be further reduced, as compared with the conversion circuit shown in FIG. 7, by adding the MPRZ and MPRZ' signals which are shifted from each other by a time corresponding to an integer multiple of the clock period. In addition, as shown in FIG. 30, the pulse count of the shift addition output is slightly larger than that in the conversion circuit shown in FIG. 7.

This application, therefore, is effective especially when the re-quantization noise is to be further reduced.

While the present invention has been described above with reference to the embodiments, the following modifications can also be made.

FIG. 6 shows a preferable example of the D/A converter to which the present invention is applied.

Especially, the arrangement of the circuit section 1 is not limited to that shown in FIG. 6. A different arrangement may be employed as long as it is designed to convert MB-DD into 1B-DD.

The above D/A converter is designed to receive MB-DD, convert the MB-DD into 1B-DD, convert the 1B-DD into an analog signal, and output the analog signal obtained by conversion.

The present invention, however, may be applied to a D/A converter simply designed to receive data other than MB-DD, e.g., 1B-DD, convert the 1B-DD into an analog signal, and output the analog signal obtained by conversion.

The arrangement for achieving the objects of the present invention and the principle thereof are especially suitable for conversion from a digital signal into an analog signal. However, the same arrangement and principle may be applied to a loop-filter conversion from an analog signal into a digital signal (See, for example, FIG. 1).

As has been described, the 1-bit conversion circuit according to the present invention can fully suppress extra-band high-frequency components. Hence, when an output of the conversion circuit is supplied to an analog adder or an analog filter, the adder or the filter can output a signal having a sufficiently high accuracy even if the operation amplifier incorporated in the adder or the filter is one having a low throughput. The present invention can provide a 1-bit D/A conversion circuit which has no differential analog filter and which can yet generate an analog output having a sufficiently high accuracy.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A signal processing circuit for converting 1-bit digital data sampled at a period T to an analog data, comprising:

dividing means for receiving said 1-bit digital data, for outputting a first output to a first signal line and for outputting a second output to a second signal line, a first delay amount of said first signal line being different from a second delay amount of said second signal line;

a first inverter coupled to said second signal line;

a first gate circuit, having an AND gate coupled to said first signal line, for producing a first return-to-zero signal, when said 1-bit digital data represents a level "1", said first return-to-zero signal representing a first level $V_L$ during a predetermined period T1, said first return-to-zero signal representing a second level $V_n$ during a period T-T1, when said 1-bit digital data represents a level "0", said first return-to-zero signal representing said second level $V_L$ during said period T;

second gate circuit, having a NAND gate coupled to said second signal line, for producing a second return-to-zero signal, when said 1-bit digital data represents said level "0", said second return-to-zero signal representing said second level $V_L$ during said predetermined period T1, said second return-to-zero signal representing said first level $V_H$ during said period T-T1, when said 1-bit digital data represents said level "1", said second return-to-zero signal representing said first level $V_H$ during said period T; and addition means for adding said first and second return-to-zero signals.

2. A signal processing circuit as recited in claim 1, wherein a difference between said first delay amount and said second delay amount is an integer multiple of said period T.

3. A signal processing circuit as recited in claim 2, further comprising:

a first buffer circuit connected between output of said first gate circuit and addition means, said first buffer circuit including a second inverter; and a second buffer circuit connected between output of said second gate circuit and addition means, said second buffer circuit including a third inverter.

4. A signal processing circuit as recited in claim 3, further comprising:

a third buffer circuit having said first output of said dividing means as an input and outputting a first buffering signal to said first signal line and including at least one Delay type flip-flop; and a fourth buffer circuit having said second output of said dividing means as an input and outputting a second buffering signal to said second signal line and including at least one Delay type flip-flop, wherein a shift amount of said third buffer circuit is equal to a delay amount of said fourth buffer circuit.

5. A signal processing circuit as recited in claim 3, wherein said addition means comprises:

a first resistor coupled to a first input of said addition means;

a second resistor coupled to a second input of said addition means;

an addition point for adding a signal passing through said first resistor and a signal passing through said second resistor; and an inverted operational amplifier coupled to said addition point.

6. A signal processing circuit as recited in claim 5, wherein said addition means further comprises a first passive filter coupled to said addition point, and said first passive filter has a third resistor and a first capacitor.

7. A signal processing circuit as recited in claim 6, wherein said addition means further comprises a second passive filters coupled to said addition point, and said second passive filter has a fourth resistor and a second capacitors, and said first and second passive filters are connected serially to said operational amplifier.

8. A signal processing circuit as recited in claim 6 or 7, wherein an output of said inverted operational amplifier is coupled to an inverted input of said inverted operational amplifier through a third capacitor.

9. A signal processing circuit as recited in claim 8, wherein a feedback resistor is coupled to said inverted input and said output of said inverted operational amplifier.

10. A signal processing circuit as recited in claim 2, further comprising:

a first buffer circuit connected between output of said first gate circuit and addition means, said first buffer circuit including a first amplifier; and a second buffer circuit connected between output of said second gate circuit and addition means, said second buffer circuit including a second amplifier.

11. A signal processing circuit as recited in claim 10, wherein said addition means comprises:

a first resistor coupled to a first input of said addition means;

a second resistor coupled to a second input of said addition means;

an addition point for adding a signal passing through said first resistor and a signal passing through said second resistor; and a non-inverted operation amplifier coupled to said addition point.

12. A signal processing circuit for converting 1-bit digital data sampled at a period T to an analog data, said circuit comprising:

return-to-zero signal output means for receiving said 1-bit digital data and converting said 1-bit digital data into a first return-to-zero signal and a second return-to-zero signal, outputting said first and second return-to-zero signals which are shifted with respect to each other; and addition means for adding said first and second return-to-zero signals; and wherein:

said first return-to-zero signal has a value of voltage $V_H$ for a pre-determined time T1 of the period T and has a value of voltage $V_L$ at a different level for a remaining time T-T1 in the period T when said 1-bit digital data is at a level "1", and has the value of said voltage $V_L$ for entire period T when said 1-bit digital data is at level "0"; and said second return-to-zero signal has the value of said voltage $V_L$ for said predetermined time T1 and has the value of said voltage $V_H$ for said remaining time T-T1 in the period T when said 1-bit digital data is at a level "0" and has the value of said voltage $V_H$ for the entire period T when said 1-bit digital data is at a level "1".

13. A signal processing circuit as recited in claim 12, wherein:

said return-to-zero signal output means further comprises:

dividing means for receiving said 1-bit digital data and dividing the data into first and second non-return-to-zero signals;

inverting means for inverting a level of said second non-return-to-zero signals;

delay means for delaying one of said first and second non-return-to-zero signals by at least one of said period T; and generating means for generating said first return-to-zero signal from said first non-return-to-zero and generating said second return-to-zero signal from said second non-return-to-zero signal.

14. A signal processing circuit as recited in claim 13, wherein:

said generating means includes:

AND gate circuit including a first input receiving an inverted clock having said period T, and a second input receiving one of said first and second non-return-to-zero signals, said AND gate circuit outputting said first return-to-zero signal; and NAND gate circuit including a first input receiving said inverted clock, and a second input receiving the other of said first and second non-return-to-zero signals, said NAND gate circuit outputting said second return-to-zero signal.

\* \* \* \* \*